Sept. 24, 1957 K. W. CATTERMOLE 2,807,719

ELECTRIC PULSE-GENERATORS EMPLOYING SEMICONDUCTORS

Filed July 2, 1954 2 Sheets-Sheet 1

Inventor
K. W. CATTERMOLE
By Philip M. Bolton
Attorney

Inventor
K. W. CATTERMOLE
By Philip M. Bolton
Attorney 2,807,719

ELECTRIC PULSE GENERATORS EMPLOYING SEMICONDUCTORS

Kenneth William Cattermole, London, England, assignor to International Standard Electric Corporation, New York, N. Y., a corporation of Delaware Application July 2, 1954, Serial No. 441,055

Claims priority, application Great Britain July 20, 1953

7 Claims. (Cl. 250—36)

The present invention relates to electric pulse generating circuits employing semiconductor amplifying devices known as crystal triodes.

A crystal triode usually consists of a crystal of germanium (or other semiconducting crystal with analogous properties) having a base electrode making low resistance contact with the crystal, and two other electrodes (commonly, but not necessarily, fine sharply pointed wires or catswhiskers) making rectifying contact with its surface. It will be assumed that the crystal consists of N-type germanium, in which case, when the device is used as an amplifier, one of the electrodes, called the emitter electrode, will be polarised positively with respect to the base electrode, and the other, called the collector electrode, will be polarised negatively with respect to the base electrode. The emitter and collector electrodes are respectively input and output electrodes of the amplifier.

A number of circuits have already been proposed in which crystal triodes are adapted as trigger devices or pulse generators.

Hitherto, however, the characteristics of crystal triodes which are commercially obtainable have been found to be so variable that many of the previously proposed circuits will not operate reliably unless the crystal triodes to be used are subjected to a selection process in order to pick out a comparatively small percentage having suitable characteristics. This is very wasteful and inconvenient, and causes difficulties when a crystal triode has to be replaced in a circuit.

The principal object of the present invention is to provide a pulse generator or trigger circuit including one or more crystal triodes so designed that the operation is substantially independent, within wide limits, of the characteristics of the individual crystal triode used, whereby a high percentage of commercially available crystal triodes can be used in the circuits without the necessity for special selection or special adjustment of the circuit.

The invention accordingly provides a circuit for generating electric pulses comprising a crystal triode having a current gain which exceeds unity under normal operating conditions, a regenerative feedback circuit, having a periodic feature, arranged to couple the emitter and collector electrodes of the crystal triode in such manner that the crystal triode assumes one or other of two different current conditions, at least one of which is unstable, and means for deriving the pulses from an electrode of the crystal triode, the arrangement being such that the period during which the crystal triode remains in the unstable condition is determined substantially by the periodic feature of the regenerative feedback circuit.

The current gain of a crystal triode is expressed as the ratio of the collector current to the corresponding emitter current. This ratio is usually determined when the potentials of the emitter and collector electrodes with respect to the base electrodes have some specified values suitable for the operation of the crystal triode as an amplifier, which may be called the "normal condition." The current gain is not much affected by relatively large variations of the collector potential, but it may become very small or zero if the collector potential becomes abnormally small.

The invention will be described with reference to the accompanying drawings in which.

Figure 1:
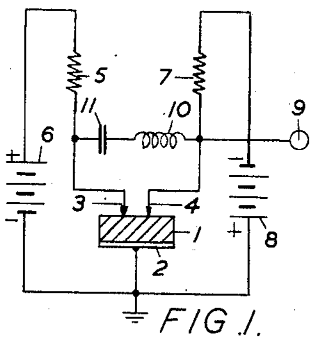
Fig. 1 shows a schematic circuit diagram of an electric pulse generator according to the invention.

Fig. 1 shows a circuit according to the invention for generating a train of regularly repeated pulses. It comprises a crystal triode 1 having a base electrode 2 and emitter and collector electrodes 3 and 4. The current gain of the crystal triode under normal conditions should be greater than unity. The base electrode 2 is connected to ground, and the emitter electrode 3 is connected through a resistor 5, having a resistance $R_1$, to a positive polarising source 6 having its negative terminal connected to ground. The collector electrode 4 is connected through a second resistor 7, having a value $R_2$, to a negative polarising source 8 having its positive terminal connected to ground. $R_1$ should generally be much higher than $R_2$. An output terminal 9 is connected to the collector electrode 4. The two sources 6 and 8 may each have potentials of about 60 volts, for example.

The emitter and collector electrodes are connected together by a series resonant circuit consisting of an inductor 10 and a capacitor 11, which forms a regenerative coupling.

Figure 2:
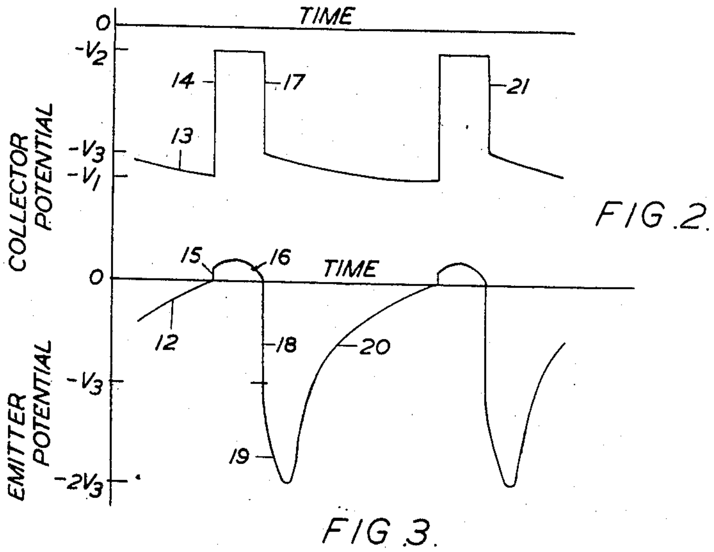
Fig. 2 shows potential curves used in explaining the operation of Fig. 1.

The manner in which the circuit operates will be explained with reference to Fig. 2. This explanation is somewhat simplified since the action is rather complicated, but the general lines are approximately correct. The resistance $R_1$ will be supposed to be large compared with $R_2$, for example about 20 times, while $R_1$ is small compared with the emitter contact resistance, and $R_2$ is small compared with the collector contact resistance, when the emitter contact is blocked.

Since most of the potentials which will be referred to in the following explanation are negative, in order to avoid misunderstanding, it will be pointed out here that a potential will be said to be higher, or lower, than another potential if it has a more positive, or a more negative value, respectively. Likewise, a potential will be said to be increasing, or decreasing, if it is becoming more positive, or more negative, respectively.

Immediately after the generation of a short pulse, the potential of the collector electrode 4 drops suddenly to a relatively large negative potential, which is communicated to the emitter electrode 3 through the resonant circuit 10, 11. The emitter contact is blocked, the collector current is very small, and the capacitor 11 is charged from the sources 6 and 8 through the resistors 5 and 7. The emitter and collector circuit resistances are in this condition very large and do not appreciably affect the charging of the capacitor 11, which takes place with a time constant approximately equal to $C(R_1+R_2)$ where C is the capacity of the capacitor 11. The emitter potential is thus rising towards zero on the curve 12 Fig. 2, owing to the progressive reduction in the current through the resistor 5, and the potential of the collector electrode is at the same time falling at a slower rate towards a negative potential $-V_1$ on the curve 13, owing to the progressive reduction in the current through the much smaller resistor 7.

When the potential of the emitter electrode 3 reaches zero, the emitter contact is unblocked, and the collector current begins to increase. This increase produces an increase of the potential of the collector electrode 4 (that is, a decrease in value of its negative potential), and this increase is communicated through the resonant circuit 10, 11 to the emitter electrode 3, thus increasing the collector current. The effect is cumulative, and the crystal triode is thereby suddenly turned on, the potential of the collector electrode rising very steeply to a very small value $-V_2$ which may be of the order of one volt, and is the value at which the current gain falls to unity. This steep rise produces the leading edge 14 of the generated pulse.

At the same time the potential of the emitter electrode 3 rises steeply by a small amount as indicated at 15, but the change in the potential of the emitter electrode can only be small (say ½ volt) because as soon as the emitter contact is unblocked, the resistance of the emitter circuit becomes suddenly very low, and so only a small proportion of the change $V_2-V_1$ of the potential of the collector electrode can be transferred to the emitter electrode. The emitter electrode 3 has now lost control of the collector current, but its potential is further increased slightly by the overswing caused by the resonant circuit 10, 11 and follows the curve 16, which is substantially a half sinewave. When the resonant circuit has reduced the potential of the emitter electrode 3 again to zero, the potential of the collector electrode 4 will be reduced and the regenerative action will cause its potential to fall sharply to a value $-V_3$, thus generating the trailing edge 17 of the pulse. Since now the emitter contact will be blocked, the resistance of the emitter circuit will be very high, and so the potential of the emitter electrode will also be reduced to substantially $-V_3$, as indicated at 18. The resonant circuit 10, 11 however produces an overswing 19, so that the potential of the emitter electrode 3 subsequently falls to practically $-2V_3$. After this overswing, the potential of the emitter electrode rises relatively slowly towards zero over the curve 20, and the potential of the collector electrode 4 falls slightly from $-V_3$ to $-V_1$, and then the process is repeated and a second pulse 21 is generated at the collector electrode 4 in like manner.

The circuit thus generates a train of nearly rectangular pulses indefinitely.

The steepness of the leading and trailing edges 14 and 17 is determined principally by the characteristics of the crystal triode. It can be shown that these edges are practically exponential, the corresponding time constant being approximately equal to $L/R(a-1)$, in which $a$ is the current gain of the crystal triode (that is, the ratio of the change in collector current to the change in emitter current which causes it), R is the effective parallel resistance of the resistor 7 and the resistance of the collector circuit, and L is the inductance of the inductor 10. Thus it is desirable that the current gain $a$ should be high, and the resistance $R_2$ of the resistor 7 should be chosen relatively high, and the inductance L should be chosen relatively low.

It will be seen that the duration of the generated pulses is determined by the resonance period of the elements 10 and 11 and will be approximately equal to $\pi\sqrt{LC}$. Furthermore, the duration of the period between the pulses is substantially determined by the time constant $C(R_1+R_2)$. If $R_2$ is small compared with $R_1$, then very approximately the inter-pulse period is equal to $CR_1.\log(1+2V_1/E)$, where E is the potential of the source 6.

The only parts of the oscillation period which appreciably depend on the characteristics of the crystal triode are the rise and fall times of the leading and trailing edges of the pulse, and if these times are made sufficiently small in the manner indicated, the effect of replacing one crystal triode by another on the duration and period of repetition of the pulses will be practically negligible.

It was stated above that L should have a low value, but it must be large enough to prevent destructive surges in the crystal triode. In the case of crystal triodes available when the circuit of Fig. 1 was devised, it was found that the minimum value of L for safety was about 200 microhenries.

It was found possible with the circuit of Fig. 1 to obtain pulses of duration from 1.5 microseconds upwards, and in favorable cases the rise and fall times of the leading and trailing edges of the pulses were of the order of 0.2 microsecond; in most cases no difficulty was obtained in obtaining rise and fall times not exceeding 0.5 microsecond.

The circuit of Fig. 1 may be modified to provide a pulse generator in which the crystal triode is normally stable in the off condition but can be switched by a triggering pulse or potential of small amplitude to generate a single output pulse. This modified arrangement is shown in Fig. 3, in which those elements which are the same as in Fig. 1 are given the same designations.

Figure 3:
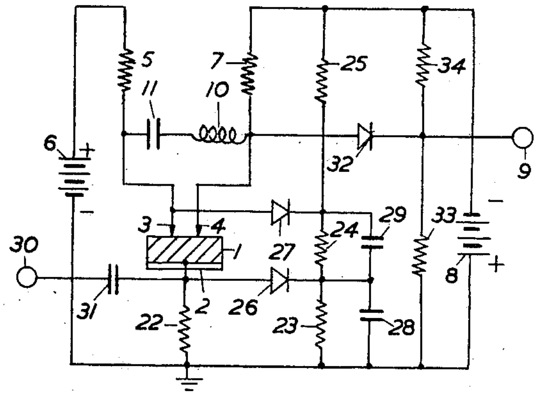
Fig. 3 shows a schematic circuit diagram of a trigger device according to the invention.

In Fig. 3, a small resistor 22 is connected in series between the base electrode 2 and ground. Three resistors 23, 24 and 25 are connected to form a potential divider connected across the source 8. The base electrode 2 is connected through a rectifier 26 to the junction point of resistors 23 and 24 selected to produce a small negative bias potential (for example about 6 volts) for the rectifier 26, which is directed so that it will prevent the potential of the base electrode from exceeding about −6 volts. The emitter electrode 3 is connected through a second rectifier 27 to the junction point of resistors 24 and 25 selected to produce a slightly greater negative bias potential (for example, about 7 volts) for the rectifier 27, arranged similarly to the rectifier 26 for preventing the potential of the emitter electrode 3 from exceeding about −7 volts. The resistors 23 and 24 are shunted respectively by large by-pass capacitors 28, 29. An input terminal 30 for a trigger pulse is connected through a blocking capacitor 31 to the base electrode 2. The collector electrode 4 is connected to the output terminal 9 through a rectifier 32 which is biased by a potential divider consisting of two resistors 33 and 34 connected in series across the source 8.

According to this arrangement, the potential of the emitter electrode 3 is normally held slightly lower (for example, 1 volt) than the potential of the base electrode 2, and the crystal triode is thereby held in the off condition. If a negative triggering potential exceeding the potential difference between the emitter and base electrodes be applied to the input terminal 30, the crystal triode will be switched on, and it will generate a single pulse substantially in the manner described with reference to Fig. 2, but the rise of the potential of the emitter electrode along the curve 20 will be stopped when it reaches the bias potential of the rectifier 27, while it is still below the potential applied to the base electrode, so the crystal triode will not be switched on again until another triggering pulse is applied at terminal 30, when another single output pulse will be generated, and so on.

The operation of Fig. 3 will be described in more detail with reference to Fig. 4.

In the resting condition of the circuit, the crystal triode is in the off condition, and a very small collector current flows. The base electrode is at a potential $-V_4$ determined by the bias of the rectifier 26 (for example $V_4=6$ volts) and the emitter electrode is at a slightly lower potential $-V_5$ determined by the bias of the rectifier 27 (for example $V_5=7$ volts). The collector electrode is at a relatively large negative potential $-V_6$.

Nothing occurs until time $t_1$ when a short negative triggering pulse is applied at terminal 30 (Fig. 3), except that the collector potential may be still falling slightly below $-V_6$, if the capacitor 11 is not completely discharged. If the amplitude of the triggering pulse is slightly greater than $V_5-V_4$ (for example, slightly greater than 1 volt), the emitter contact will become unblocked and the crystal triode will be rapidly turned on, as previously described. The collector current suddenly increases, and on account of the resistors 22 and 7, the potential of the base electrode will fall to a value $-V_7$ as indicated at 35 (Fig. 4) while that of the collector electrode will rise to a value $-V_8$, as indicated at 36, where $V_8-V_7$ is small, for example a few volts.

A small proportion of the increase in the potential of the collector electrode is communicated to the emitter electrode 3 (Fig. 3) through the resonant circuit 10, 11 as before, and this together with the sudden fall in the potential of the base electrode tends greatly to increase the emitter current, since the emitter contact is unblocked, but owing to the presence of the resistor 5 (Fig. 3), which has a relatively high value, the difference of potential between the emitter and base electrodes will in effect be limited to a small value (probably less than 1 volt) so the emitter potential actually falls suddenly from $-V_5$ to $-V_9$ as indicated at 37 where $V_9$ is slightly less than $V_7$.

The overswing 38 of the resonant circuit 10, 11 then occurs as before, and cuts off the crystal triode at time $t_2$. The potential of the collector electrode falls suddenly to $-V_{10}$, as indicated at 39, and by means of the resonant circuit drives the potential of the emitter electrode to $-V_{11}$, as indicated at 40, where $V_9-V_{11}$ is substantially equal to $2(V_8-V_{10})$. The potential of the base electrode at the same time rises again to $-V_4$. The potential of the emitter electrode then rises as indicated by the curve 41 until at time $t_3$ it reaches the value $-V_5$, at which value it is held by the rectifier 27 (Fig. 3).

Thus it will be seen that in response to the short triggering pulse applied to the input terminal 30 at time $t_1$, a single output pulse 42 is generated at the collector electrode 4. It will be evident that another short triggering pulse may be applied at any time $t_4$ later than $t_3$, when the process just described will be repeated, and a second output pulse 43 will be generated.

The circuit will only be sensitive to triggering at or after time $t_3$. Thus it could be synchronised by a train of regularly repeated triggering pulses, or other periodic wave, provided that the repetition period is not less than $t_3-t_1$.

Figure 4:
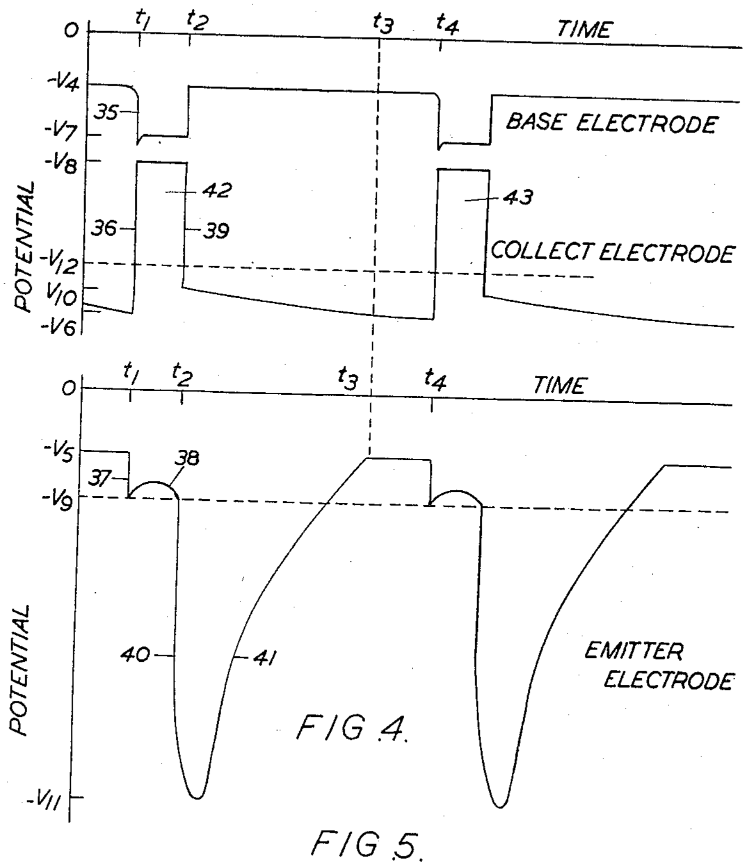
Fig. 4 shows potential curves used in explaining the operation of Fig. 3.

The rectifier 32 (Fig. 3) acts as a limiter for cutting off the lower parts of the output pulses 42, 43 shown in Fig. 4. If the resistors 33 and 34 (Fig. 3) are so chosen that the bias potential applied to the rectifier 32 is $-V_{12}$, where $V_{12}$ is a little less than $V_{10}$, then the potential of the output terminal 9 cannot fall below $-V_{12}$ and accordingly only those portions of the pulses 42 and 43 above the level $-V_{12}$ will appear at the output terminal 9, so the output pulses will then be substantially rectangular.

The rectifier 26, Fig. 3 could, if desired, be omitted, in which case the base electrode 2 would acquire a negative potential, depending on the characteristics of the crystal triode, during the period when the crystal triode is in the off condition. It would be necessary therefore to use triggering pulses of larger amplitude than before to ensure reliable triggering with all crystal triodes.

Figure 5:
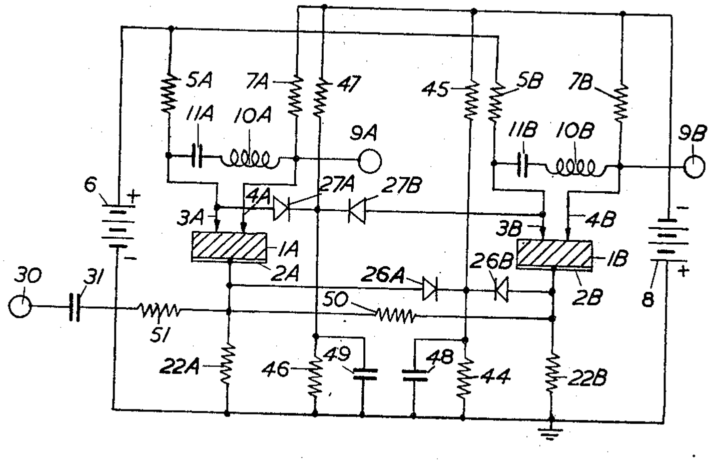
Fig. 5 shows a schematic circuit diagram of a frequency divider according to the invention.

It was pointed out above with reference to Fig. 4 that the circuit is only sensitive to triggering at or after the time $t_3$. If therefore a periodic wave of small amplitude and having a period which is slightly greater than a submultiple of order $n$ of the period $t_3-t_1$ is applied at the input terminal 30 of Fig. 3, the circuit will synchronize at every $n$th period, and will thus act as a frequency divider which divides by $n$. In practice, for reliable division, $n$ must probably be a small integer, say not greater than 5. Fig. 5 shows how two circuits similar to Fig. 3 can be connected to produce two dividing stages each of which can be designed to divide by 3, for example. Elements of the stages which are the same as corresponding elements of Fig. 3 have been given the same designations with the letter A or B added.

The two limiting rectifiers 26A and 26B for the base electrodes are biased from a potential divider consisting of two resistors 44 and 45 connected in series across the source 8, and the two limiting rectifiers 27A and 27B for the emitter electrodes are biased from a separate potential divider consisting of two resistors 46 and 47 also connected in series across the source 8. The resistors 44 and 46 are shunted with by-pass capacitors 48 and 49. The limiting potential for the base and emitter electrodes could, for example, be −6 and −7 volts as before.

The two base electrodes are coupled by a resistor 50, and a resistor 51 may be inserted, if necessary, between the blocking capacitor 31 and the base electrode 2A.

Let it be assumed that a sinewave of frequency F cycles per second is applied at terminal 30. Assuming that the crystal triode 1A is to be arranged to divide by 3, then the values of the elements 5A, 7A, 10A, 11A and 22A should be chosen so that the period $t_3-t_1$ (Fig. 3) is slightly less than $3/F$ seconds, while at the same time, the duration $t_2-t_1$ of the generated pulse, is a convenient value. Then a train of positive rectangular pulses with a repetition frequency of $F/3$ cycles per second can be obtained from terminal 9A. The resistor 51 should be chosen so that the amplitude of the waves applied to the base electrode 2A is just sufficient to trigger the crystal triode when the potential of the emitter electrode has reached the value $-V_5$ (Fig. 4).

Negative rectangular pulses like those shown in the top line of Fig. 4, and with a repetition frequency $F/3$, will be generated at the base electrode 2A, and they will be superposed on the input waves of frequency F, but will be of much greater amplitude, and will be supplied through the resistor 50 to the base electrode 2B. Resistor 50 should accordingly be chosen so that the amplitude of the negative pulses is reduced to a value which will just trigger the crystal triode 1B, the associated elements of which are so chosen that the corresponding period $t_3-t_1$ is slightly greater than $9/F$ seconds. Then a train of positive rectangular pulses with a repetition frequency $F/9$ can be obtained from terminal 9B. It may be pointed out that a complex wave could be obtained from the base electrode 2B which consists of the original wave of frequency F of vary small amplitude having superposed on it a train of negative rectangular pulses of frequency $F/9$, every third one of which is of greater amplitude than the others.

It may be added that limiting rectifiers (not shown) corresponding to 32 (Fig. 3), and biased in a similar manner, may be provided between the collector electrodes 4A and 4B of Fig. 5 and the corresponding output terminals 9A and 9B.

In a particular example of Fig. 5 designed to divide a frequency of 100 kilocycles per second by 9 in two stages, the elements of the circuit had the following values:

| | |
|---|---|
| Potential of sources 6 and 8 ............ volts .. | 60 |
| Resistors 5A and 5B ............ ohms .. | 60,000 |
| Resistors 7A and 7B ............ do .... | 2,200 |
| Resistors 22A, 22B, 50, and 51 ............ do .... | 1,500 |
| Inductors 10A and 10B ............ millihenry .. | 1 |
| Capacitor 11A ............ micromicrofarads .. | 0.47 |
| Capacitor 11B ............ do .... | 2.0 |
| Limiting potential of base electrodes 2A and 2B ............ volts .. | −6 |
| Limiting potential of emitter electrodes 3A and 3B ............ do .... | −7 |

It should be pointed out that the two frequency dividing stages can be arranged to divide by different integers $m$ and $n$. The period $t_3-t_1$ must then be made slightly less than $m/F$ and $mn/F$, respectively, for the first and second circuits. Clearly three or more similar dividing stages could be arranged in cascade in like manner.

Figure 6:
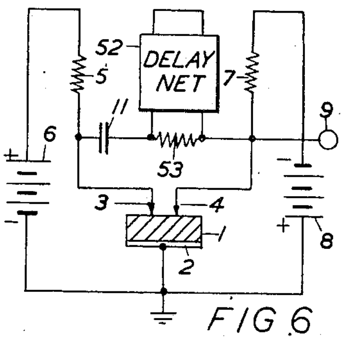
Fig. 6 shows a modification of Fig. 1.

It has been explained above that the length of the period $t_2-t_1$ during which the crystal triode remains in the on condition is determined by the resonant circuit 10, 11. This period may alternatively be determined by a delay network, as shown in Fig. 6, which is a modified form of Fig 1. The modification consists in replacing the inductor 10 by the input circuit of a delay network 52, the output end of which is short circuited. The positive pulse generated at the collector electrode 4 is transmitted through the delay line and returns inverted after reflection at the short circuited end. The leading edge 14 (Fig. 2) will be negative-going after reflection and will drive the emitter electrode negative thus turning off the crystal triode, the emitter potential then falling suddenly as indicated at 18, Fig. 2. There is, however, no overswing corresponding to 19, and the period during which the crystal triode is switched off is determined by the discharge of the capacitor 11 through the circuit resistances.

If necessary, a terminating resistor 53 may be provided for the input terminals of the delay network 52 to prevent further reflection at the input terminals which might interfere with the operation of the circuit.

It will be evident that the duration of the generated pulses will be twice the delay corresponding to one transit through the delay network 52.

Figs. 3 and 5 may be modified by replacing the inductor 10 by a delay network, in the manner shown in Fig. 6.

It should be pointed out that the series resonant circuit 10, 11 of Figs. 1, 3 and 5, and the delay network of Fig. 6, both have a periodic feature which determines the duration of the generated pulses. In the case of the resonant circuit, the periodic feature is the oscillation period $2\pi\sqrt{LC}$, while in the case of the delay network, it is the period of oscillation of a pulse introduced into the network, which pulse travels backwards and forwards by repeated reflection at the input and output terminals, when such terminals are not terminated by the characteristic impedance of the network. This oscillation period is $2t$, where $t$ is the time for a single transit of the pulse through the network.

It will be understood that the invention is not limited to any particular choice of values, such as those given above as examples, or to the particular triggering or output arrangements described. For instance, the circuit may be triggered by the application of a negative pulse to the base electrode (as described) or of a positive pulse to the emitter electrode, or by a coincidence of pulses applied to both electrodes. It may be arranged to deliver a positive output pulse from the collector electrode, or a negative output pulse from the base electrode, or pulses from both these points. Furthermore, although the crystal triode has been assumed to be of the kind employing an n-type semiconductor, the circuits can be adapted to crystal triodes with a p-type semiconductor by simply reversing the polarity of each of the sources 6 and 8 (Figs. 1, 3, 5 and 6).

It is also possible to use a junction type crystal triode instead of the catswhisker type provided that it is of a kind in which the current gain is greater than 1.

While the principles of the invention have been described above in connection with specific embodiments, and particular modifications thereof, it is to be clearly understood that this description is made only by way of examples and not as a limitation on the scope of the invention.

What I claim is:

1. A circuit for generating electric pulses, comprising a crystal triode having emitter, collector and base electrodes and having a current gain greater than unity under normal operating conditions, a series resonant circuit connected between said emitter and collector electrodes having parameters so that the crystal triode assumes either a blocked or unblocked condition, two direct current sources of opposite polarity connected between the base electrode and the emitter and collector electrodes, respectively, each of the last mentioned electrodes being connected to the corresponding direct current source through an individual feed resistor, the potentials of the two direct current sources and the values of the feed resistors being selected so that the period during which the crystal triode remains in the unblocked condition is substantially determined by the resonance period of said series resonant circuit and means for deriving output pulses from an electrode of the crystal triode.

2. A circuit for generating electric output pulses comprising a crystal triode having emitter, collector and base electrodes and having a current gain greater than unity under normal operating conditions, two direct current sources of opposite polarity connected between the base electrode and the emitter and collector electrodes, respectively, each of the last-mentioned electrodes being connected to the corresponding direct current source through an individual feed resistor, a series resonant circuit connecting the collector electrode directly to the emitter electrode and having parameters, whereby the crystal triode is caused to assume either a blocked or an unblocked condition, the unblocked condition being unstable, and means for deriving the output pulses from the crystal, triode, the potentials of the two direct current sources and the values of the feed resistors being selected so that the period during which the crystal triode remains in the unblocked condition is substantially equal to half the resonance period of the series resonant circuit, and that the currents flowing while the crystal triode is unblocked are substantially independent of the variations in the characteristics of the crystal triode.

3. A trigger circuit according to claim 2, comprising means for applying a triggering potential to switch the crystal triode from the blocked to the unblocked condition, and means for preventing the difference of potential between the emitter and base electrodes from changing sign after the crystal triode has returned to the blocked condition, except on the subsequent application of the triggering potential.

4. A circuit according to claim 2 in which the output pulses are derived from the collector electrode, comprising limiting means connected to the collector electrode for shaping the output pulses substantially to rectangular form.

5. A trigger circuit for generating substantially rectangular electric output pulses comprising a crystal triode having emitter, collector and base electrodes and having a gain which exceeds unity under normal operating conditions, two direct current sources of opposite polarity for polarising respectively the emitter and collector electrodes with respect to the base electrode, each source being connected to the corresponding emitter or collector electrode through a corresponding one of two resistors, a regenerative coupling circuit having a periodic feature arranged to connect the emitter and collector electrodes and having parameters whereby the crystal triode assumes either a blocked or unblocked condition, one of said conditions being stable, means for applying a triggering potential to switch the crystal triode from the stable to the unstable condition, whereby a single rectangular pulse is generated, means for limiting the potential of the emitter electrode of the crystal triode after the return to the stable condition to a value such that the emitter electrode will be held blocked until unblocked by the application of a subsequent triggering potential, and means for deriving the output pulses from said crystal triode, the circuit elements associated with the crystal triode being so selected that the period during which the crystal triode remains in the unstable condition is determined substantially by the periodic feature of the coupling circuit and is substantially independent of variations in the characteristics of the crystal triode.

6. A trigger circuit according to claim 5, comprising means for limiting the potential of the base electrode of the crystal triode after the return to the stable condition so that the difference of potential between the emitter and base electrodes shall not be less than a specified minimum value.

7. A trigger circuit according to claim 5 in which the said direct current sources are connected to the base electrode through a resistor common to the two sources, and in which the triggering potential is applied to the base electrode of the crystal triode.

References Cited in the file of this patent

UNITED STATES PATENTS

| | | |
|---|---|---|
| 2,595,208 | Bangert | Apr. 29, 1952 |
| 2,679,594 | Fromm | May 25, 1954 |
| 2,692,337 | Hanson | Oct. 19, 1954 |

FOREIGN PATENTS

| | | |
|---|---|---|
| 144,789 | Australia | Dec. 22, 1949 |